United States Patent [19]

Kakimoto et al.

[11] Patent Number: 5,522,683
[45] Date of Patent: Jun. 4, 1996

[54] DRILLING APPARATUS

[75] Inventors: Masakazu Kakimoto; Takashi Suzuki, both of Aichi-ken, Japan

[73] Assignee: UHT Corporation, Aichi-ken, Japan

[21] Appl. No.: 346,183

[22] Filed: Nov. 22, 1994

[30] Foreign Application Priority Data

Dec. 27, 1993 [JP] Japan .............................. 5-069895 U
Sep. 22, 1994 [JP] Japan .............................. 6-227726

[51] Int. Cl.⁶ ............................ B23B 41/00; B23B 49/00
[52] U.S. Cl. ...................... 408/13; 364/474.02; 408/16; 408/67
[58] Field of Search .................................. 408/3, 13, 16, 408/67; 364/474.02, 474.34

[56] References Cited

U.S. PATENT DOCUMENTS

| | | |
|---|---|---|
| 4,909,678 | 3/1990 | Kakimoto . |
| 5,036,574 | 8/1991 | Kakimoto . |
| 5,347,462 | 9/1994 | Okuda et al. ........................... 408/16 |
| 5,351,316 | 9/1994 | Kakimoto . |

FOREIGN PATENT DOCUMENTS

| | | | |
|---|---|---|---|
| 60-238208 | 11/1985 | Japan . | |
| 60-263604 | 12/1985 | Japan . | |
| 166914 | 7/1987 | Japan | 408/16 |
| 64-11404 | 2/1989 | Japan . | |
| 19006 | 1/1992 | Japan | 408/13 |
| 4-41110 | 2/1992 | Japan . | |
| 184806 | 7/1994 | Japan | 408/16 |

OTHER PUBLICATIONS

English Language Abstract of Japanese Patent Laid-Open No. Hei 4-41110.
English Language Abstract of Japanese Patent Laid-Open No. Sho 60-238208.
English Language Abstract of Japanese Patent Laid-Open No. Sho 60-263604.

Primary Examiner—Daniel W. Howell
Attorney, Agent, or Firm—Greenblum & Bernstein

[57] ABSTRACT

Disclosed is a drilling apparatus intended to obtain an image of a drilling mark for detecting the center of the drilling mark, irrespective of the material of a work (transparent material or nontransparent material). The drilling apparatus includes: a working table on which a work having a drilling mark is set; a lower lighting element provided under the working table for emitting a light to the drilling mark through a drill port; an upper lighting element for emitting a light to the drilling mark from the upper side; a camera unit provided on the working table for receiving a transmission image of the drilling mark emitted by the lower lighting element and a reflection image of the drilling mark emitted by the upper lighting element; an image processing unit for processing an image signal received by the camera unit into a binary signal and searching the binary image for detecting the center of the drilling mark; a drill; and a feed mechanism communicating with to the image processing apparatus and the drill for correctively moving the drill to the center position of the drilling mark in the X and Y directions and allowing the drill to drill the work at the center of the drilling mark, wherein the lower lighting element and the upper lighting element are switchable to each other.

7 Claims, 5 Drawing Sheets

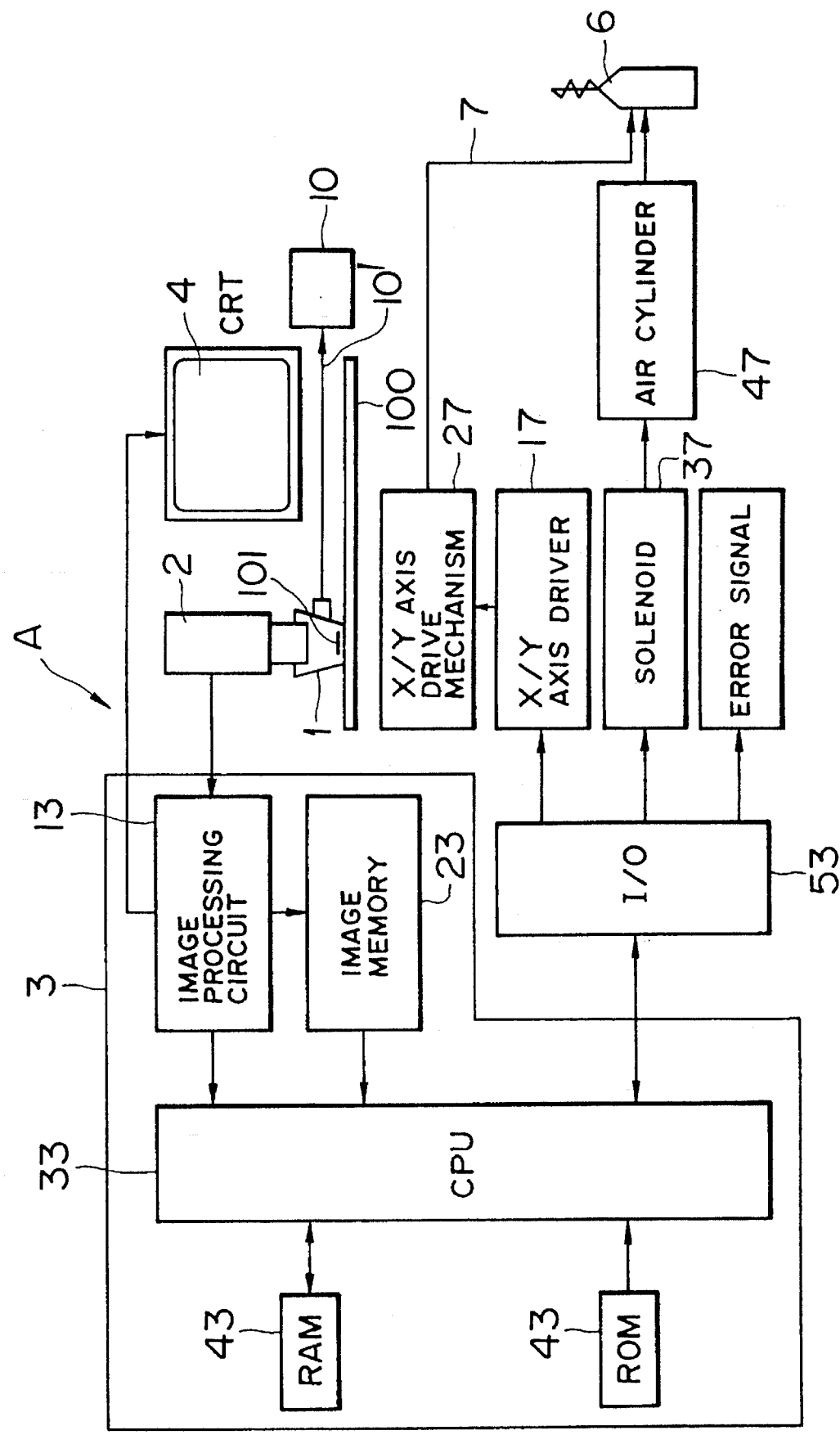

DRILLING APPARATUS

BACKGROUND OF THE INVENTION

1. Field of the Invention

The present invention relates to a drilling apparatus for drilling a work such as a printed board and a thin board at a drilling mark attached to the work. In particular, the present invention concerns a drilling apparatus for receiving an image of a drilling mark of a work set on a working table by a camera unit, processing the image by an image processing unit and detecting the center of the target mark, and correctively moving a drill provided under the working table, thereby drilling the work at the center of the target mark.

2. Description of the Related Art

Conventionally, the drilling apparatus of this type has been known, for example in Examined Japanese Patent Publication No. SHO 64-11404. This drilling apparatus is operated by the steps of emitting a light to a drilling mark attached on a printed board by a spot light provided under a working table; receiving a transmission image by a camera unit; processing the image signal into a binary signal and displaying the enlarged binary image on a monitor; searching the binary image on the monitor by an image processing unit for detecting the center position of the drilling mark (binary image); and correctively moving a drill by an X/Y axis feed mechanism on the basis of the detection data, thereby drilling the printed board at the center of the drilling mark.

This prior art technique, however, fails to detect the drilling in the case where a work is molded of an opaque material.

The prior art drilling apparatus has the additional disadvantages as follows:

A large space under a working table is required to provide the spot light, resulting in the increased size of the drilling apparatus.

A work is subjected to thermal strain due to the radiation heat by the spot light. This deteriorates the accuracy in the detection of the center of the drilling mark.

Chips, which are produced during drilling, are scattered on the work, thereby reducing the drilling accuracy, and further, they are scattered around the drilling apparatus, thus exerting an adverse effect on the environment within the working room and on sanitary management.

The bulb of the spot light tends to be burnt out, which reduces the efficiency of the drilling operation.

SUMMARY OF THE INVENTION

An object of the present invention is to obtain an image of a drilling mark for detecting the center of the drilling mark, irrespective of the material of a work (transparent material or nontransparent material).

To achieve the above object, according to the present invention, there is provided a drilling apparatus including:

a working table provided with a drill port, on which a work having a drilling mark is set;

a lower lighting means provided under the working table for emitting a light to the drilling mark through the drill port;

an upper lighting means provided over the working table for emitting a light to the drilling mark from the upper side;

a camera unit provided on the working table for receiving a transmission image of the drilling mark emitted by the lower lighting means and a reflection image of the drilling mark emitted by the upper lighting means;

an image processing unit for processing an image signal received by the camera unit into a binary signal and displaying the binary signal on a monitor, and searching the binary image on the monitor for detecting the center of the drilling mark;

a drill provided under the working table; and a feed mechanism communicating with to the image processing apparatus and the drill for correctively moving the drill to the center position of the drilling mark in the X and Y directions and allowing the drill to drill the work at the center of the drilling mark, wherein the lower lighting means and the upper lighting means are switchable to each other.

In this technical means, both a transmission image and a reflection image can be obtained by selectively using the lower lighting means for emitting a light to a drilling mark from the lower side through the drill port, and the upper lighting means provided over the working table for emitting a light to the drilling mark from the upper side. Either of the transmission image or the reflection image is processed into a binary image and is displayed on the monitor. The binary image is searched from the cursor on the monitor, and the center of the drilling mark is accurately and quickly detected. The drill is thus correctively moved by the feed mechanism and drills the work at the center of the drilling mark.

The drilling apparatus of the present invention is capable of switching the lower lighting means for obtaining a transmission image of a drilling mark and the upper lighting means for obtaining a reflection image of the drilling mark, and accordingly, it can detect the center of the drilling mark and drill the work at the center of the drilling mark, irrespective of the material of the work (transparent material or nontransparent material).

The lower lighting means may be composed of LEDs spaced at equal intervals around the inner peripheral surface of the drill port or around the edge of the opening portion of the rear side of the drill port.

In this technical means, LEDs emit cold light to a drilling mark from the position close to the drilling mark.

Since the cold light, which does not give any thermal strain to a work, is emitted to a drilling mark from the position close to the drilling mark through a drill port, the slight deflection of the work is prevented and thereby a clean transmission image can be obtained. Moreover, the LEDs only occupy the area near the drill port, thereby enabling the miniaturization of the drilling apparatus.

The upper lighting means may be composed of LEDs spaced at equal intervals along the circumference on the inner surface of a vertically movable lighting holder molded of an opaque material in a cylindrical shape.

The lighting holder has a lower half portion having a diameter larger than that of the drilling mark, and which is adapted to abut on the work in such a manner as to surround the drilling mark from the upper side.

The camera unit is mounted on the lighting holder in such a manner as to cover the upper opening portion of the lighting holder.

In this technical means, the lighting holder prevents the coming-in of the externally disturbed light, and the cold light from the LEDs disposed along the circumference on the inner surface of the lighting holder can be collected onto a drilling mark from the opening portion of the lower half portion which has a diameter larger than that of the drilling mark and surrounds the drilling mark.

This technical means makes it possible to prevent the slight deflection of the work due to thermal strain and the coming-in of the externally disturbed light, and to collect a light onto the drilling mark resulting in the obtained clear reflection image.

The lower lighting means may include:

a transparent lighting holder having a ring shape in a plan view, which is mounted around the edge of the opening portion of the rear side of the drill port;

cutouts formed from the lower side so as to be tilted upward, and spaced at equal intervals along the circumference on the lighting holder;

a plurality of LEDs inserted in and supported by the cutouts such that the leading edges thereof are positioned under the drill port; and a plastic coating film covering the portion of the outer surface of the lighting holder excluding the desired range of the upper side portion to which the leading edges of the LEDs face.

This technical means prevents the coming-in of the external disturbed light by means of the plastic coating film covering the outer surface of the transparent lighting holder, and it collects a light onto a drilling mark from the upper portion with no plastic coating film through the transparent lighting holder.

Accordingly, the technical means makes it possible to collect a light having a specified luminous intensity not affected by the externally disturbed light only to the drilling mark, and hence to obtain a more clear transmission image.

The upper lighting means may include:

a vertically movable lighting holder molded of a transparent material into a cylindrical shape;

recessed portions are formed, spaced at equal intervals or continuously, along the circumference on the upper end surface of the lighting holder;

a plurality of LEDs each inserted in and supported by the recessed portions; and a plastic coating film covering the portions of the inner and outer surfaces of the lighting holder excluding the vicinity of the lower end portion thereof and the recessed portion, wherein the lighting holder has a lower half portion having a diameter larger than that of the drilling mark, and which is adapted to abut on the work in such a manner as to surround the drilling mark from the upper side; and the camera unit is mounted on the lighting holder in such a manner as to cover the upper opening portion of the lighting holder.

This technical means prevents the coming-in of the externally disturbed light by means of the plastic film covering the outer surface of the transparent lighting holder and also prevents the reflection of the internally disturbed light to the lens of the camera unit by means of the plastic film covering the inner surface of the lighting holder, and it collects a light onto the drilling mark from the portion near the lower end portion with no plastic film through the transparent lighting holder.

Accordingly, this technical means makes it possible to collect a light having a specified luminous intensity not affected by the externally and internally disturbed lights onto the drilling mark, and hence to obtain a more clear reflection image.

The lighting holder of the upper lighting means may communicated with a vacuum unit for recovering chips.

This technical means supplies chips scattered on the surface of a work from the interior of the lighting holder to a recovery unit.

Accordingly, since chips can be sucked and recovered from the interior of the lighting holder without any scattering, it becomes possible to prevent the reduction of the drilling accuracy due to the scattering of the chips on the work, and to prevent the sanitary management from being affected by the chips scattered around the drilling apparatus. Moreover, since the lighting holder serves as the suction portion, it is not required to separately support the supporting means (lighting holder) for the light source and a nozzle for discharging chips, thereby significantly simplifying the structure of the drilling apparatus.

BRIEF DESCRIPTION OF THE DRAWINGS

FIG. 5 is a block diagram showing the association between mechanisms and devices of the drilling apparatus;

DESCRIPTION OF THE INVENTION

Hereinafter, embodiments of the present invention will be described with reference to the drawings.

Figure 6:
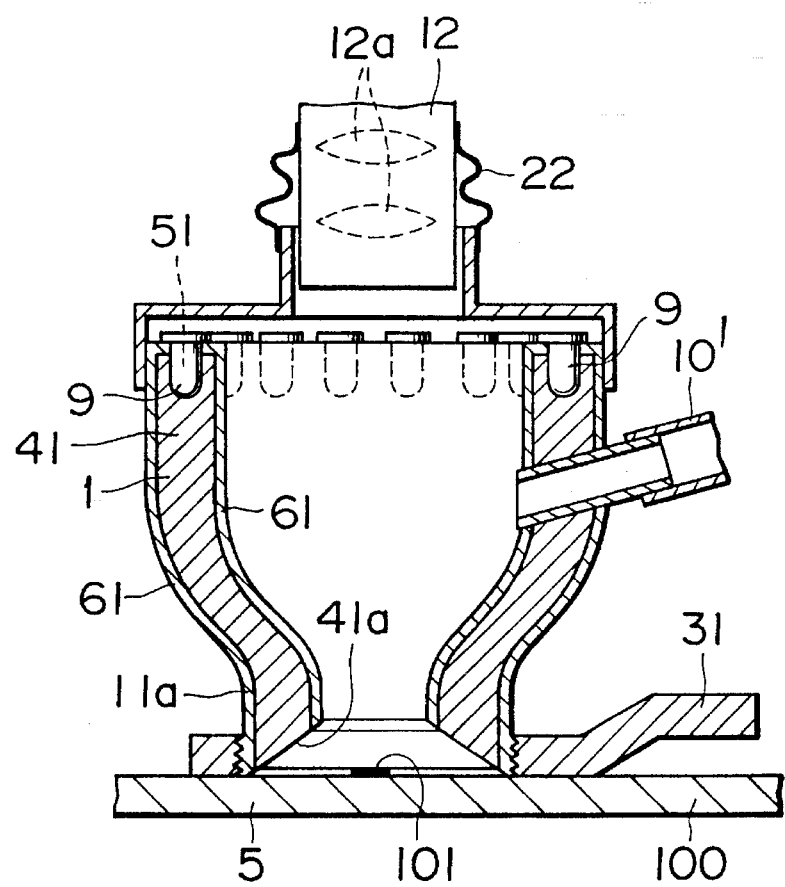
FIG. 6 is a partially enlarged sectional view showing an upper lighting means of a second embodiment.
Figure 7:
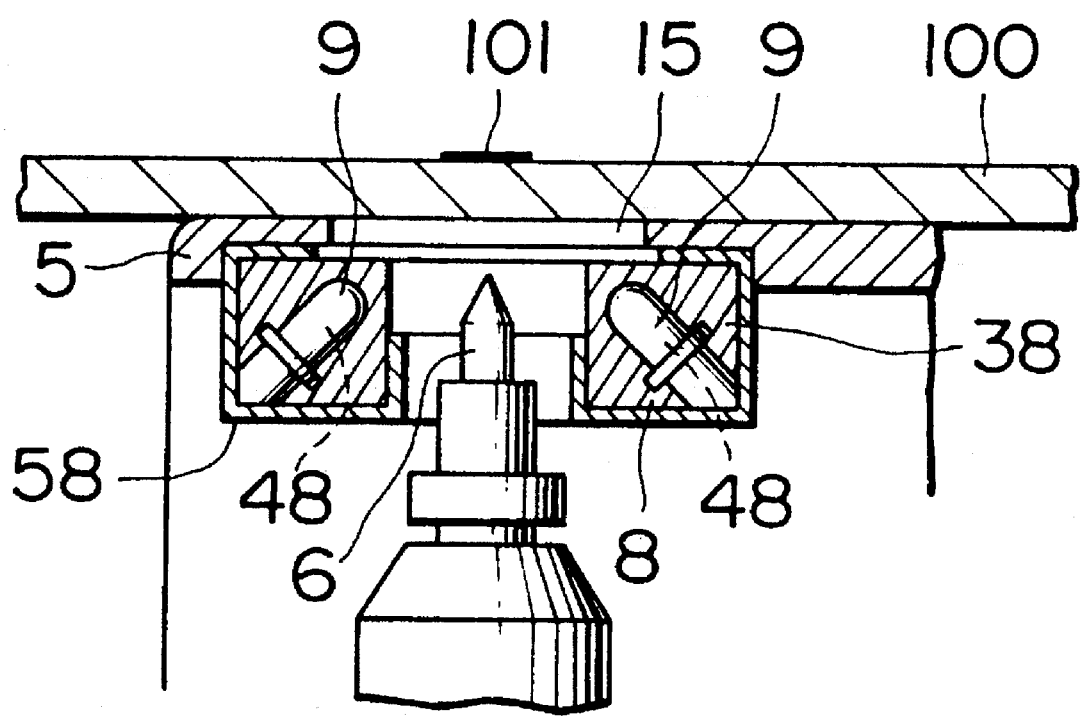
FIG. 7 is a partially enlarged sectional view showing a lower lighting means of the second embodiment.

FIGS. 1 to 5 show a first embodiment, and FIGS. 6 and 7 show a second embodiment.

In the first embodiment, the character A designates a drilling apparatus which includes an upper case A1 and a lower case A2. The upper and lower cases A1 and A2, each containing necessary units and mechanisms, are disposed to be close to each other while holding therebetween an approach space <a> into which a work or a printed board 100 approaches by a moving mechanism (not shown).

Figure 1:
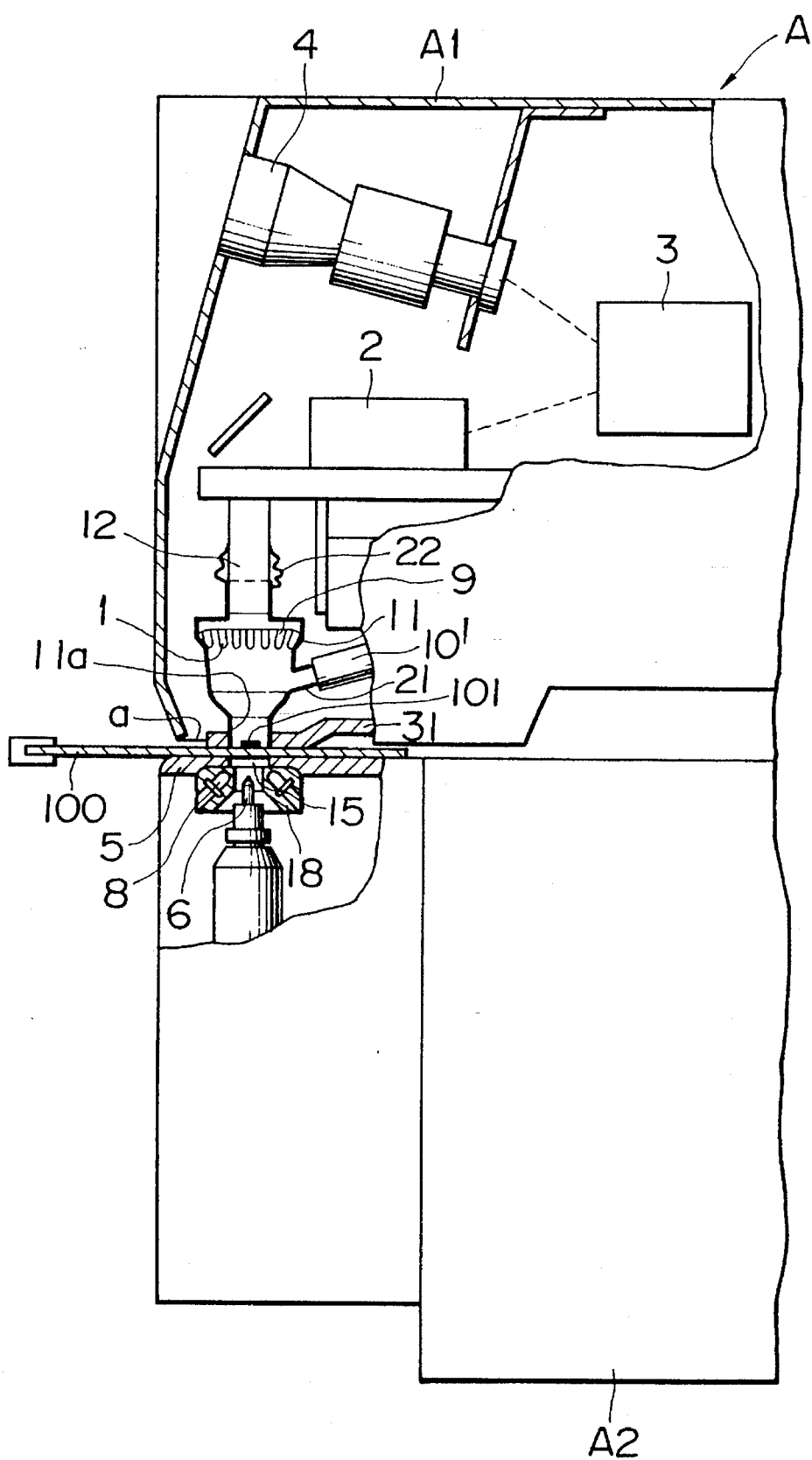
FIG. 1 is a front view of a first embodiment of a drilling apparatus of the present invention, with parts being partially broken away.
Figure 2:
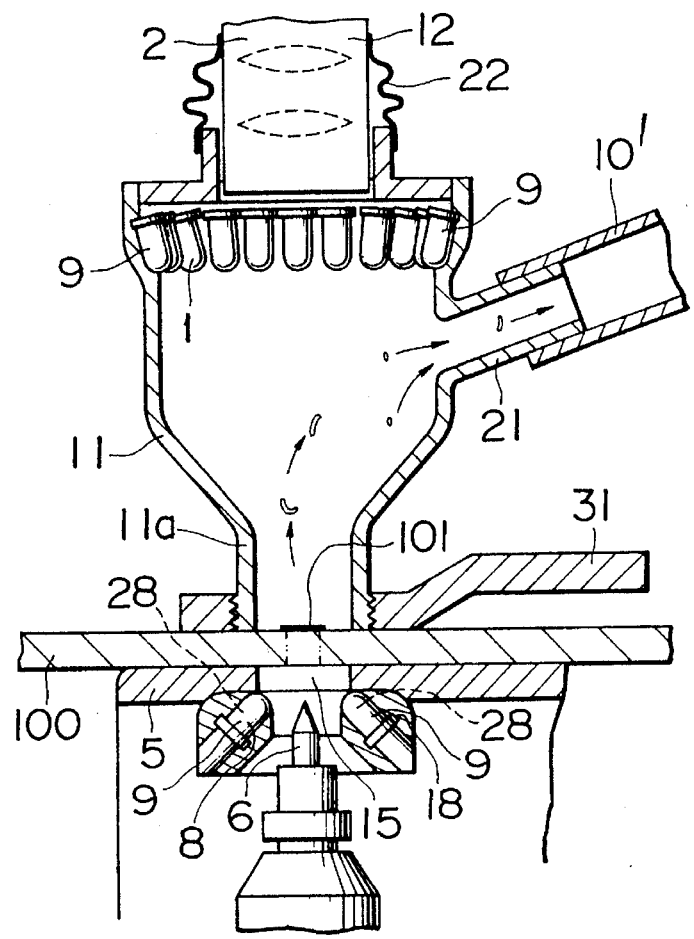
FIG. 2 is a partially enlarged sectional view of an essential portion.
Figure 3:
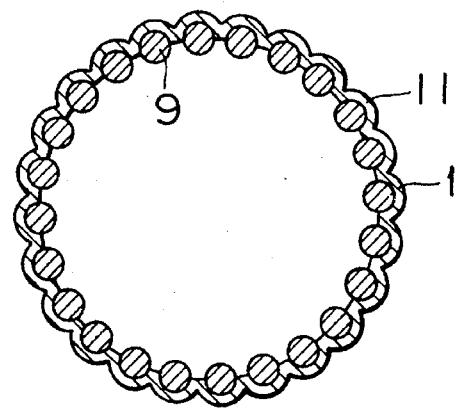
FIG. 3 is a sectional view taken along line 3—3 of FIG. 2.
Figure 4:
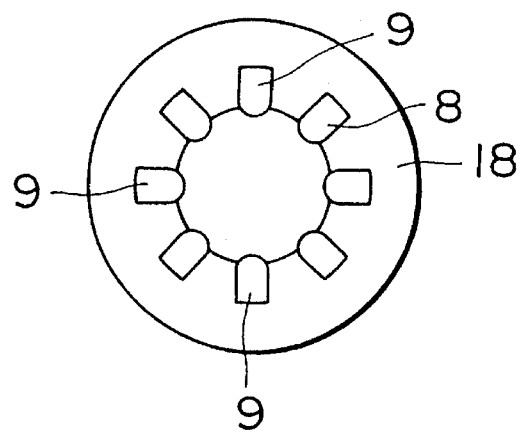
FIG. 4 is a plan view of a lower lighting means.

The upper case A1, having the lower surface of the leading edge being opened as shown in FIG. 1, contains an upper lighting means 1, a camera unit 2 for receiving an image of a drilling mark 101 of the printed board 100, an image processing unit 3 for processing an image signal received by the camera unit 2 into a binary signal, and a monitor 4 communicating with the image processing unit 3 for displaying the binary image.

The lower case A2, having the upper surface serving as a working table 5 formed with a drill port 15 at a specified position, contains a drill 6, a drill feed mechanism 7 and a lower lighting means 8.

The upper lighting means 1 includes a lighting holder 11 molded substantially in a cylindrical shape using an opaque material. LEDs 9 are spaced at equal intervals along the inner peripheral surface of the lighting holder 11 near the upper end portion thereof. A suction tube 10' communicating with a vacuum unit 10 is connected to a tilting cylinder 21 provided on the upper half portion of the lighting holder 11 in a manner to project from a suitable position thereof. A supporting arm 31 is fixed on the lower end portion of the lighting holder 11. The supporting arm 31 is vertically movable by a lifting mechanism (not shown) for vertically moving the lighting holder 11. The lighting holder is to slightly hold the printed board 100 in cooperation with the working table 5.

The lighting holder 11 is gradually reduced in diameter as it approaches the lower portion such that a lower half portion 11a is larger in diameter than the drilling mark 101 attached on the printed board 100. A lens cylinder 12 of the camera unit 2 is internally fitted in the opening portion of the upper end of the lighting holder 11. The lens cylinder 12 is further connected to the edge portion of the above opening portion of the upper end by means of a flexible tube 22 such that the vertical movement of the lighting holder 11 is absorbed by the extension of the flexible tube 22.

In addition, the flexible tube 22 acts to perfectly shield the space within the lighting holder 11 from the exterior when the lighting holder 11 abuts on the printed board 100.

The lower lighting means 8 has a lighting holder 18 molded in a ring shape in a plan view using an opaque material. Holes 28 are perforated at equal intervals along the circumference of the lighting holder 18 in a manner to be tilted upward. The LEDs 9 are each inserted in and supported by the holes 28. As shown in the figure, the lighting holder 18 having the LEDs 9 is mounted around the edge of the opening portion on the rear side of the drill port 15 of the working table 5. The LEDs 9 are adapted to emit a light obliquely and upwardly toward the drill port 15.

The camera unit 2 is composed of a CCD camera, which is provided to be located directly over the drilling mark 101 of the printed board 100 fed to face the drill port 15 by the automatic control of the above-described moving mechanism (not shown).

The image processing unit 3 includes an image processing circuit 13 for arithmetically processing the image information as a digital signal converted by an A/D converter (not shown) in a binary signal, an image memory 23 for storing the binary data, a central processing unit 33 for executing a specified control program, and a memory unit 43 for storing the data necessary for the central processing unit 33. With this arrangement, the variable density image signal of the drilling mark 101 can be converted into a binary signal by the image processing circuit 13 and written in the image memory 23.

The monitor 4 is adapted to display the image stored in the image memory 23 and scan the coordinate system from the center of the cursor.

The lower lighting means 8 and the upper lighting means 1 are switchable to each other.

In the drill feed mechanism 7, the feed amount of an X/Y axis drive mechanism 27 is controlled on the basis of a command which is supplied to an X/Y driver circuit 17 from the central processing unit 33 by way of an I/O port 53.

The function of the drilling apparatus in the first embodiment will be described below.

The printed board 100 is carried in an approach space <a> between the upper case A1 and the lower case A2 by the moving mechanism (not shown) such that the drilling mark 101 is positioned directly under the opening portion of the lower end of the lighting holder 11. This feed amount is previously determined.

The upper lighting means 1 then descends and slightly holds the printed board 100 in cooperation with the working table 5. Subsequently, either of the lower lighting means 8 and the upper lighting means 1 is selected, and a light is emitted from the upper side or the lower side to the printed board 100.

The above selection may be manually performed using a switch or automatically performed using a photoelectric sensor of light reflection type (not shown) capable of automatically detecting the material of the printed board 100.

In the case where the printed board 100 is made of a transparent material, a light is emitted to the drilling mark 101 from the lower lighting means 8 through the drill port 15. On the other hand, in the case where the printed board 100 is made of nontransparent material, a light is emitted to the drilling mark 101 from the upper lighting means 1.

The light emitted from either of the lower lighting means 8 and the upper lighting means 1 can produce a clean transmission image or reflection image without any shadow area along the edge because the light is emitted uniformly from the portion around the edge of the drilling mark 101.

The transmission image or reflection image is supplied to the camera unit 2, and the image signal is processed in the image processing apparatus. The binary image thus processed is enlarged and displayed on the monitor 4.

The image processing unit 3 searches for the binary image along the center of the cursor on the screen of the monitor 4 for detecting the center of the drilling mark 101. In the image processing unit 3, a threshold value is set to perform the discrimination between while and black areas. The level higher than the threshold value is judged to be the white area (or black area); reversely, the level lower than the threshold is judged to be the black area (or white area). On the basis of the above threshold value, the binary image is searched both in the X and Y directions for obtaining the intersection between two vertical bisectors, each connecting two points in the X or Y direction where the gradation is changed. The intersection thus obtained is determined to be the center of the drilling mark 101.

The corrective distance from the center of the cursor which is calculated on the basis of the above-described detection is determined as an error between the center of the drilling mark 101 and the center of the drill 6. On the basis of the calculated value, the central processing unit 33 correctively moves the feed mechanism 7 such that the center of the drilling mark 101 conforms with the center of the drill 6. The drill 6 is then moved up by a solenoid 37 and an air cylinder 47, and it drills the printed board 100 at the center of the drilling mark 101. The detection of the center of the drilling mark 101 is accurately and quickly performed by the image processing unit 3.

The vacuum unit 10 is operated during or before the drilling for sucking chips from the interior of the lighting holder 11 and supplying them to a recovery unit (not shown).

In the first embodiment, as described above, the lower lighting by the lower lighting means and the upper lighting by the upper lighting means are switchable according to the type of the molding material (transparent material or nontransparent material) of the printed board 100, and a cold light is uniformly emitted from the whole periphery of the edge of the drilling mark 101 by the LEDs 9. Accordingly, it becomes possible to obtain a clear transmission image or reflection image without generation of any thermal strain of the printed board 100, and hence to drill the printed board 100 accurately at the center of the drilling mark 101.

Moreover, since the vacuum unit 10 sucks chips, it becomes possible to prevent the chips from being scattered on the printed board 100, the drilling apparatus, and the working room.

Next, there will be described a second embodiment for obtaining a more clear transmission image or reflection image. This embodiment is different from the first embodiment in terms of the concrete structures of the lower lighting means 8 and the upper lighting means 1, and accordingly, parts corresponding to those in the first embodiment are designated at the like reference numerals and the explanation thereof is omitted.

The lower lighting means 8 has a transparent lighting means 38 formed in a ring in a plan view. Cutouts 48 are formed from the rear side of the lighting holder 38, spaced at equal intervals, along the circumference thereof in a manner to be tilted upward. LEDs 9 are each inserted in and supported by the cutouts 48. Subsequently, the portion of the outer surface of the lighting holder 38 excluding the upper portion to which the leading edges of the LEDs 9 face, are covered with a plastic coating film 58.

The lighting holder 38 is molded of a transparent material such as polyacrylic resin or polycarbonate in the same shape as that of the lighting holder of the first embodiment.

The plastic coating film 58 is formed by nickel based plastic plating. The outer surface of the lighting holder 38 is mirror-finished, and the portion of the outer surface excluding the upper portion to which the leading edges of the LEDs 9 face is subjected to nickel based plastic plating.

The plastic coating film 58 acts to prevent the coming-in of externally disturbed light, and to collect a light having a specified luminous intensity to the drilling mark 101 from the portion of the transparent lighting holder 38 to which the leading edges of the LEDs 9 face.

With this plastic coating film 58, it becomes possible to prevent the non-uniformity of the luminous intensity due to the dullness of the transmission image and externally disturbed light which is caused by the emission of light in all directions from the whole lighting holder 38, and to collect a light having a specified luminous intensity uniformly onto the drilling mark 101 from the portion around the edge of the drilling mark 100 thereby obtaining a clear transmission image.

The upper lighting means 1 has a lighting holder 41 molded of a transparent material in the same shape as that of the lighting holder in the first embodiment.

Recessed portions 51 are formed, spaced at equal intervals or continuously, along the circumference on the upper end surface of the lighting holder 41. LEDs 9 are each inserted in and supported by the recessed portions 51. The portions of the inner and outer surfaces of the lighting holder 41, excluding the vicinity of the lower end portion and the recessed portions 51, are covered with a plastic coating film 61.

The vicinity of the lower end portion of the lighting holder 41 is constituted of a cut surface 41a tilted from the inner side to the outer side as shown in the figure.

The plastic coating film 61 is formed by the same nickel based plastic plating as described above. The inner and outer surfaces of the lighting holder 41 are mirror-finished, and the portions of the inner and outer surfaces excluding the cut surface 41a being the vicinity of the lower end portion and the recessed portions 51 are subjected to nickel based plastic plating. With this plastic coating film 61, it becomes possible to prevent the coming-in of the externally disturbed light and the reflection of the internally disturbed light to the lens 12a, and to collect a light having a specified luminous intensity to the drilling mark 101 from the cut surface 41a not covered with the plastic coating film 61.

In the second embodiment, as described above, since a light having a specified luminous intensity is collected to the drilling mark 101 from the portion around the edge thereof in such a state as to prevent the influences of the externally and internally disturbed lights, it becomes possible to obtain a more clear transmission image or reflection image, and hence to accurately detect the center of the drilling mark and drill the printed board at the center of the drilling mark.

In addition, there may be adopted a structure that the plastic coating film is not provided in the vicinity of the lower end portion of the lighting holder 41 over the desired range for collecting a light to the drilling mark. In this case, the cut surface 41a may be omitted.

Having described specific preferred embodiments of the invention with reference to the accompanying drawings, it will be appreciated that the present invention is not limited to those precise embodiments, and that various changes and modification can be effected therein by one of ordinary skill in the art without departing from the scope or spirit of the invention as defined by the appended claims.

What is claimed is:

1. A drilling apparatus comprising: a working table provided with a drill port, on which a work having a drilling mark is set;

a lower lighting means provided under said working table for emitting a light to the drilling mark through the drill port;

an upper lighting means provided over said working table for emitting a light to the drilling mark from the upper side;

a camera unit provided on said working table for receiving a transmission image of the drilling mark emitted by said lower lighting means and a reflection image of the drilling mark emitted by said upper lighting means;

an image processing unit for processing an image signal received by said camera unit into a binary signal and displaying the binary signal on a monitor, and searching the binary image on the monitor for detecting the center of the drilling mark;

a drill provided under said working table; and a feed mechanism communicating with said image processing apparatus and said drill for correctively moving said drill to the center position of the drilling mark in the X and Y directions and allowing said drill to drill the work at the center of the drilling mark, wherein said lower lighting means and said upper lighting means are switchable to each other.

2. A drilling apparatus according to claim 1, wherein said lower lighting means is composed of LEDs spaced at equal intervals around the inner peripheral surface of the drill port or around the edge of the opening portion of the rear side of the drill port.

3. A drilling apparatus according to claim 1, wherein said upper lighting means is composed of LEDs spaced at equal intervals along the circumference on the inner surface of a vertically movable lighting holder molded of an opaque material in a cylindrical shape;

said lighting holder has a lower half portion having a diameter larger than that of the drilling mark, and which is adapted to abut on the work in such a manner as to surround the drilling mark from the upper side; and said camera unit is mounted on said lighting holder in such a manner as to cover the upper opening portion of said lighting holder.

4. A drilling apparatus according to claim 1, wherein said lower lighting means includes:

a transparent lighting holder having a ring shape in a plan view, which is mounted around the edge of the opening portion of the rear side of the drill port;

cutouts formed from the lower side so as to be tilted upward, spaced at equal intervals, along the circumference on said lighting holder;

a plurality of LEDs inserted in and supported by said cutouts such that the leading edges thereof are positioned under the drill port; and a plastic coating film covering the portion of the outer surface of said lighting holder excluding the desired range of the upper side portion to which the leading edges of said LEDs face.

5. A drilling apparatus according to claim 1, wherein said upper lighting means includes:

a vertically movable lighting holder molded of a transparent material into=a cylindrical shape;

recessed portions are formed, spaced at equal intervals or continuously, along the circumference on the upper end surface of said lighting holder;

a plurality of LEDs each inserted in and supported by said recessed portions; and a plastic coating film covering the portions of the inner and outer surfaces of said lighting holder excluding the vicinity of the lower end portion thereof and said recessed portion, wherein said lighting holder has a lower half portion having a diameter larger than that of the drilling mark, and which is adapted to abut on the work in such a manner as to surround the drilling mark from the upper side; and said camera unit is mounted on said lighting holder in such a manner as to cover the upper opening portion of said lighting holder.

6. A drilling apparatus according to claim 3, wherein said lighting holder of said upper lighting means is communicating with a vacuum unit for recovering chips.

7. A drilling apparatus according to claim 5, wherein said lighting holder of said upper lighting means is communicating with a vacuum unit for recovering chips.

* * * * *

UNITED STATES PATENT AND TRADEMARK OFFICE
CERTIFICATE OF CORRECTION

PATENT NO. : 5,522,683
DATED : June 4, 1996
INVENTOR(S) : M. KAKIMOTO

It is certified that error appears in the above-indentified patent and that said Letters Patent is hereby corrected as shown below:

On the title page, item [57], "ABSTRACT", line 17, delete "to".

At column 9, line 17 (claim 5, line 4), change "into=a" to ---into a---.

Signed and Sealed this

Nineteenth Day of November, 1996

Attest:

BRUCE LEHMAN

*Attesting Officer*   *Commissioner of Patents and Trademarks*